(12) United States Patent
Woods et al.

(10) Patent No.: US 6,512,990 B1
(45) Date of Patent: Jan. 28, 2003

(54) DISTRIBUTED TRIGGER NODE

(75) Inventors: Stanley P. Woods, Cupertino, CA (US); John C. Eidson, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/477,872

(22) Filed: Jan. 5, 2000

(51) Int. Cl.[7] .................................................. H04J 3/06
(52) U.S. Cl. ........................ 702/125; 370/503; 370/507
(58) Field of Search ...................... 702/125, 89; 701/48, 701/114, 115, 28, 30, 25, 32; 340/825.2, 825.01; 370/394, 503, 507, 473; 368/46, 47

(56) References Cited

U.S. PATENT DOCUMENTS

| | | | | |
|---|---|---|---|---|
| 4,455,654 A | | 6/1984 | Bhaskar et al. ................ 371/20 |
| 4,945,486 A | * | 7/1990 | Nitschke et al. ............. 701/114 |
| 5,293,374 A | * | 3/1994 | Eidson ........................ 324/73.1 |
| 6,278,710 B1 | * | 8/2001 | Eidson ......................... 370/394 |
| 6,370,159 B1 | * | 4/2002 | Eidson ......................... 370/503 |

* cited by examiner

Primary Examiner—Kamini Shah

(57) ABSTRACT

A trigger node for a measurement and control system which enables relatively precise timing in the application of stimuli and/or measurement of responses without specialized adaptation of analog signaling to the measurement and control system. A trigger node according to the present teachings includes a synchronized clock that maintains a time using a synchronization scheme that provides the timing precision needed for the application of stimuli and/or measurement of responses. A trigger node according to the present teachings further includes mechanisms for asserting a trigger signal when the time from its synchronized clock matches a trigger time associated with the trigger signal. Multiple trigger nodes may be used to coordinate the timing of multiple measurement and control devices by appropriately setting the trigger times in the trigger nodes.

15 Claims, 3 Drawing Sheets

DISTRIBUTED TRIGGER NODE

BACKGROUND OF THE INVENTION

1. Field of Invention

The present invention pertains to the field of measurement and control systems. More particularly, this invention relates to distributed trigger nodes in measurement and control systems.

2. Art Background

A measurement and control system typically includes a set of measurement and control devices. One example of a measurement and control system is a test system which includes a set of instruments which are arranged to provide stimuli to and/or measure responses of a system or device under test. Examples of instruments include volt meters, oscilloscopes, signal generators, and logic analyzers to name a few examples.

It is often desirable in a measurement and control system to provide relatively precise timing of the activities performed by the measurement and control devices. Such precision may involve a single measurement and control device or multiple measurement and control devices. For example, it may be desirable to cause a signal generator to apply a particular signal at a particular time or cause an oscilloscope to measure a response to the particular signal at a particular time.

One prior method for coordinating the activities of measurement and control devices involves the use of an instrument control bus. An example of an instrument control bus is one that conforms to the IEEE 488 standard. For example, the application of stimuli and/or the measurement of responses by instruments may be triggered by transferring a "group execute trigger" command to the instruments via the control bus. Unfortunately, the time interval between receipt of a group execute trigger command by an instrument and the actual application of stimuli or measurement of a response by that instrument typically varies from instrument to instrument. This variation in instrument timing may be unsuitable for measurement and control systems which require more precise coordination among the instruments.

Another prior method for coordinating the activities of measurement and control devices involves precisely controlling the timing of analog trigger signals applied to the trigger inputs of the measurement and control devices. For example, an instrument typically provides one or more trigger inputs for controlling the timing of its stimulus or measurement function. Unfortunately, the adaptation of analog signaling to a measurement and control system is usually time consuming. This typically increases the costs of a measurement and control system. Moreover, changes to a measurement and control system such as relocation of instruments or replacement of instruments usually require changes to the analog signaling design and thereby increases costs associated with a measurement and control system.

SUMMARY OF THE INVENTION

A trigger node for a measurement and control system is disclosed which enables relatively precise timing in the application of stimuli and/or measurement of responses without specialized adaptation of analog signaling to the measurement and control system. A trigger node according to the present teachings includes a synchronized clock that maintains a time using a synchronization scheme that provides the timing precision needed for the application of stimuli and/or measurement of responses. A trigger node according to the present teachings further includes mechanisms for asserting a trigger signal when the time from its synchronized clock matches a trigger time associated with the trigger signal. Multiple trigger nodes may be used to coordinate the timing of multiple measurement and control devices by appropriately setting the trigger times in the trigger nodes.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
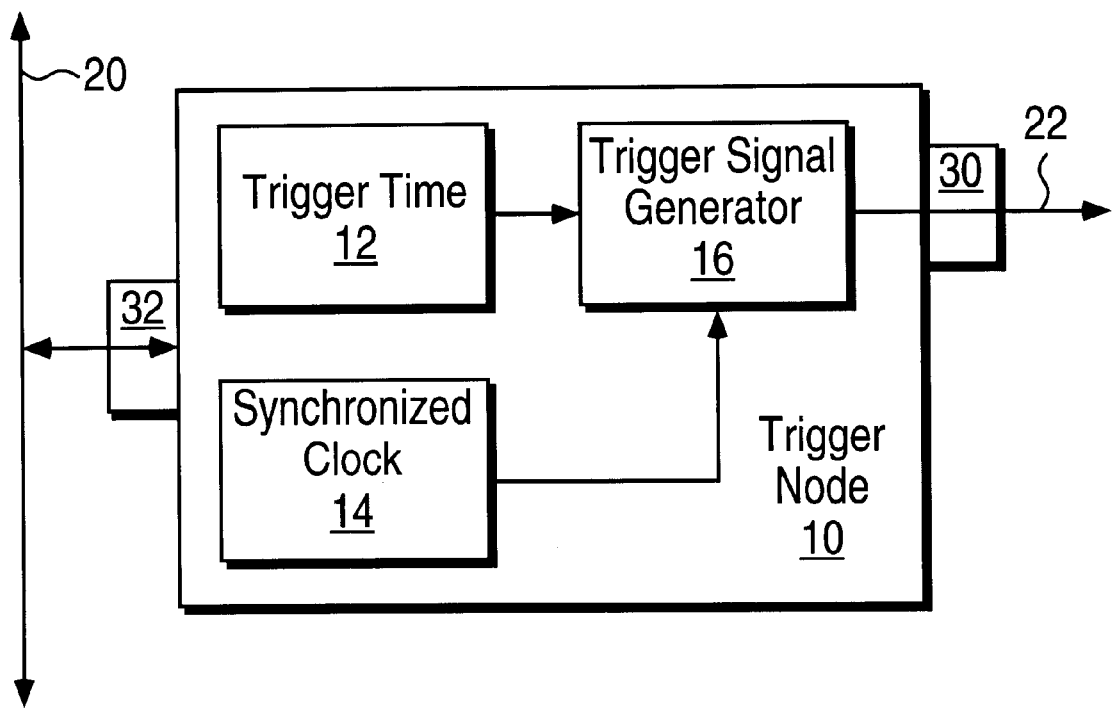
FIG. 1 shows a trigger node which enables relatively precise timing in the application of stimuli and/or measurement of responses.

FIG. 1 shows a trigger node 10 which enables relatively precise timing in the activities of measurement and control devices according to the present teachings. The trigger node 10 includes a synchronized clock 14 that maintains synchronized time. The trigger node 10 includes a trigger time register 12 that holds a trigger time. The trigger time is set to a time at which a trigger signal 22 is to be applied to a trigger input of a measurement control device (not shown). The trigger time may be set using message transfer via a network 20 or may be preprogrammed into the trigger time register 12.

The trigger node 10 further includes a trigger signal generator 16 that asserts the trigger signal 22. The trigger signal generator 16 asserts the trigger signal 22 when the time in the synchronized clock 14 matches the trigger time held in the trigger time register 12. The precision of timing in the trigger signal 22 derives from the precision of the time maintained in the synchronized clock 14. The trigger node 10 may be placed close enough to the trigger input of an measurement and control device so as to obviate the need for specialized analog signaling schemes to meet timing constraints.

In one embodiment, the time in the synchronized clock 14 is synchronized using a synchronization protocol described in U.S. Pat. No. 5,566,180. This synchronization protocol involves the transfer of timing data packets and related packets via the network 20 and offers the advantage of relatively low bandwidth utilization on the network 20 so as not to impede messaging associated with other functions. Moreover, in one embodiment, this protocol yields synchronization resolution down to to 50 nanoseconds in the timing of the trigger signal 22. In other embodiments, the trigger node 10 implements the network time protocol (NTP) to synchronize the time in the synchronized clock 14.

The network 20 may be a packetized network such as Ethernet or a network such as LonTalk which is adapted to control systems. Alternatively, the network 20 may be implemented as a serial or parallel communication bus or other mechanism for communication.

The trigger signal 22 is provided to a 50 ohm or high impedance trigger input of an measurement and control device via a connector 30 which may be a BNC connector. The trigger node 10 includes a connector 32 which is adapted to the particulars of the physical implementation of the network 20. For example, if the network 20 is Ethernet then the connector 30 may be an RJ45 connector. In some embodiments, the trigger node 10 may be physically contained within the standard form factor of a network or measurement and control device connector.

Figure 2:
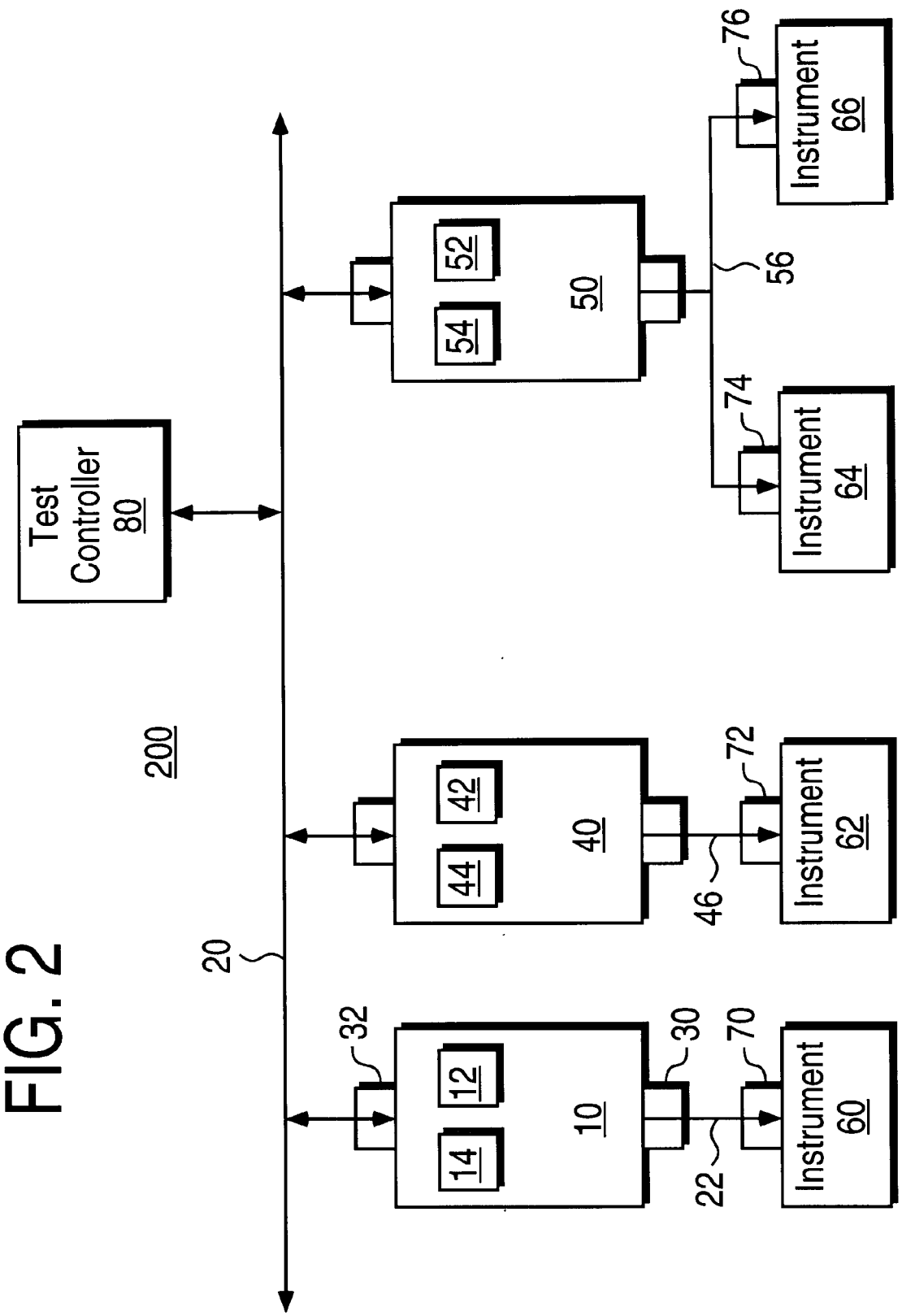
FIG. 2 shows an example measurement and control system that includes a set of trigger nodes and corresponding instruments with trigger inputs that are driven by the trigger nodes.

FIG. 2 shows a measurement and control system 200 arranged as a test system that includes the trigger node 10 and a set of trigger nodes 40 and 50. The trigger nodes 10, 40, and 50 may be distributed throughout the measurement and control system 200 to provide relatively close proximity to a set of corresponding instruments 60–66.

The trigger nodes 40 and 50 each include trigger signal functionality similar to that in the trigger node 10. For example, the trigger node 40 includes a trigger time register 42 and a synchronized clock 44 and the trigger node 50 includes a trigger time register 52 and a synchronized clock 54.

The trigger node 40 asserts the trigger signal 22 when the time in the synchronized clock 14 reaches the trigger time held in the trigger time register 12. Similarly, the trigger node 40 asserts a trigger signal 46 when the time in the synchronized clock 44 reaches the trigger time held in the trigger time register 42 and the trigger node 50 asserts a trigger signal 56 when the time in the synchronized clock 54 reaches the trigger time held in the trigger time register 52. The trigger signal 22 drives a trigger input 70 of the instrument 60, the trigger signal 46 drives a trigger input 72 of the instrument 62, and the trigger signal 56 drives a trigger input 74 of the instrument 64 and a trigger input 76 of the instrument 66.

The measurement and control system 200 includes one or more test controllers such as a test controller 80 that sets the trigger times in the trigger time registers 12, 42, and 52. The test controller 80 may be embodied as a computer system. The test controller 80 may set the trigger times in the trigger time registers 12, 42, and 52 by transferring messages via the network 20 which are addressed for the appropriate trigger nodes 10, 40, and 50. Each trigger node 10, 40, and 50 receives the appropriate message, extracts the trigger time contained therein, and writes the trigger time into the corresponding trigger time register 12, 42, or 52.

Alternatively, each of the trigger nodes 10, 40, and 50 may implement the functionality of a web server that constructs a web page that enables a web client to set a value in the corresponding trigger time register 12, 42, or 52. This embodiment enables any web server having access to the network 20 to set the trigger times in the trigger nodes 10, 40, and 50. For example, the test controller 80 may implement web browser software that enables it to set the trigger times in the measurement and control system 200.

The precision in the timing of the trigger signals 22, 46, and 56 with respect to one another derives from the precision of synchronization among the synchronized clocks 14, 44, and 54. For example, assume that it is desired to trigger all of the instruments 60–66 at the same trigger time=t1. This is accomplished by setting t1 in each of the trigger time registers 12, 42, and 52. Thereafter, the trigger nodes 10, 40, and 50 assert the trigger signals 22, 46, and 56 at time t1±Δt where Δt represents the accuracy of time synchronization among the synchronized clocks 14, 44, and 54.

As another example, assume that it is desired to trigger the instrument 60 at the trigger time=t1 and to trigger the instrument 62 at trigger time=t2 and to trigger the instruments 64 and 66 at trigger time=t3. This is accomplished by setting t1, t2, and t3 in the trigger time registers 12, 42, and 52, respectively. Thereafter, the trigger node 10 asserts the trigger signal 22 at time t1±Δt, the trigger node 40 asserts the trigger signal 46 at time t2±Δt, and the trigger node 50 asserts the trigger signal 56 at time t3±Δt.

In one embodiment, the times maintained by the synchronized clocks 14, 44, and 54 and the trigger times set in the trigger time registers 12, 42, and 52 are real-times. This may be accomplished using a real-time clock that functions as a master clock for the synchronization protocol used by the synchronized clocks 14, 44, and 54. The master real-time clock may be contained in the test controller 80 or may be provided by another node on the network 20. The real-times may be generated by a GPS receiver or other traceable time source.

Figure 3:
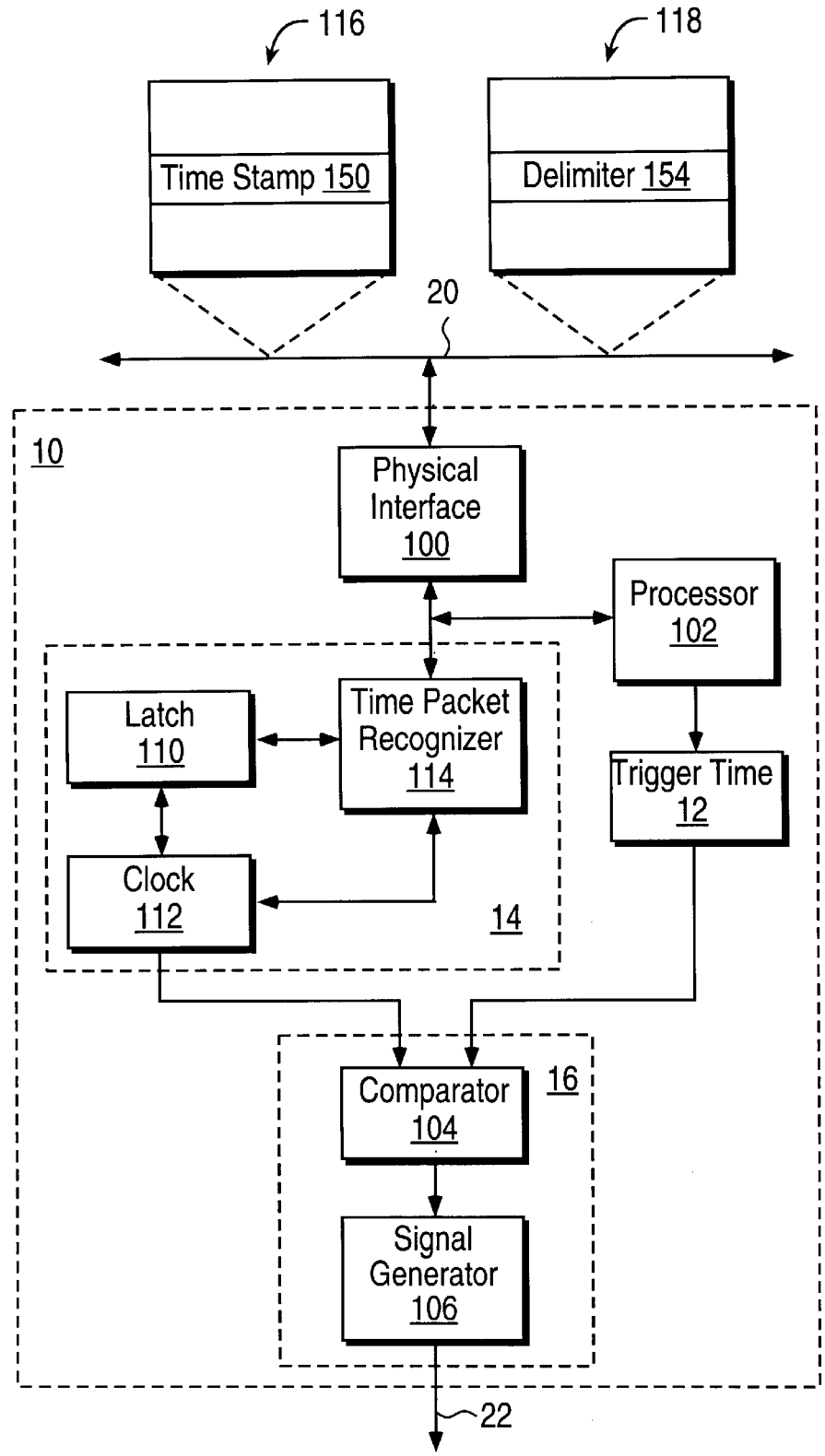
FIG. 3 shows one embodiment of a trigger node according to the present teachings.

FIG. 3 shows one embodiment of the trigger node 10. The synchronized clock 14 in the trigger node 10 includes a time packet recognizer 114, a clock 112, and a latch 110. The trigger node 10 includes a physical interface 100 that enables transmission and reception of packets via the network 20. The physical interface 100 provides received packets to the time packet recognizer 114 and to a processor 102. The processor 102 extracts trigger times from the appropriate received packets and writes the trigger times into the trigger time register 12.

The trigger signal generator 16 in this embodiment includes a comparator 104 and a signal generator 106. The comparator 104 compares the time maintained by the clock 112 with the trigger time in the trigger time register 12. A match between the time from the clock 112 and the trigger time causes the signal generator 106 to assert the trigger signal 22. The signal generator 106 includes circuitry that is adapted to the physical requirements of the trigger input an instrument. In other embodiments, firmware executed by the processor 102 determines when to cause the signal generator 106 to assert the trigger signal 22 by reading the clock 112 and comparing its time to the trigger time. In other embodiments, the result of the comparison is used to direct the processor 102 to execute firmware for generating the trigger signal 22.

In this embodiment of the trigger node 10, the synchronized clock 14 maintains synchronized time in response to timing data packets and follow up packets which are transferred via the network 20. For example, a timing data packet 118 and a follow up packet 116 are carried on the network 20. The timing data packet 118 and the follow up packet 116 are generated by a master clock on the network 20. The master clock may be contained in the test controller 80 or on another node reachable via the network 20. The master clock may be a real-time clock.

The timing data packet 118 includes a delimiter 154 that identifies it as a timing data packet for the synchronization protocol of the synchronized clock 14. The follow up packet 116 includes a time stamp 150. The time stamp 150 indicates the local time in the master clock when the timing data packet 118 was generated.

The time packet recognizer 114 receives the timing data packet 118 through the physical interface 100. The time packet recognizer 114 detects a unique timing point in the recovered bit stream for the timing data packet 118. Upon detection of the unique timing point, the time packet recognizer 114 causes the latch 110 to latch a time value from the clock 112. The time value held in the latch 110 indicates the local time at which the time packet recognizer 114 received the timing data packet 118. Thereafter, the time packet recognizer 114 receives the follow up packet 116 and extracts the time stamp 150. The difference between the time stamp 150 and the time value in the latch 110 indicates the relative synchronization of the master clock and the clock 112. Once this difference is computed the time packet recognizer 114 uses it to adjust the time value in the clock 112 to conform it to the master clock.

The adjustment of the time value in the clock 112 may be accomplished by implementing the clock 112 as a counter driven by an oscillator with sufficient stability and resolution given the timing precision needed for the trigger signal 22. The least significant few bits of the counter may be implemented as an adder so that an increment on oscillator periods may be occasionally increased or decreased to effectively speed up or slow down the clock 112 in accordance with the results of the computation of the difference between the time stamp 150 and the time held in the latch 110.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A trigger node for a measurement and control system, comprising:

synchronized clock that maintains a time;

means for synchronizing the time held in the synchronized clock;

means for obtaining a trigger time for a trigger signal from a test controller for the measurement and control system;

means for asserting the trigger signal when the time from the synchronized clock matches the trigger time.

2. The trigger node of claim 1, wherein the means for obtaining comprises means for receiving the trigger time via a network.

3. The trigger node of claim 1, wherein the means for synchronizing the time comprises means for synchronizing the time in response to one or more timing data packets carried on a network.

4. The trigger node of claim 1, wherein the time in the synchronized clock is real-time and the trigger time is real-time.

5. The trigger node of claim 1, wherein the trigger signal is adapted to a trigger input of a test instrument.

6. A measurement and control system, comprising:

a set of measurement and control devices each having at least one trigger input which causes the performance of a corresponding measurement and control device function;

a set of trigger nodes for providing a trigger signal to each of the trigger inputs, each trigger node having a synchronized clock such that the synchronized clocks maintain a synchronized time with respect to one another, each trigger node having means for asserting the corresponding trigger signal when the synchronized time in the corresponding synchronized clock matches a trigger time for the corresponding trigger signal;

a test controller for providing the trigger times to the trigger nodes.

7. The measurement and control system of claim 6, wherein the test controller transfers the trigger times to the trigger nodes via a network.

8. The measurement and control system of claim 6, wherein the synchronized clocks maintain the synchronized time in response to one or more timing data packets carried on a network.

9. The measurement and control system of claim 8, further comprising a master clock that generates the timing data packets on the network.

10. The measurement and control system of claim 9, wherein the master clock is a real-time clock such that the synchronized clocks in the trigger nodes synchronize to real-time and each trigger time is real-time.

11. The measurement and control system of claim 6, wherein the measurement and control devices are a set of test instruments.

12. A method for triggering a node in a measurement and control system, comprising the steps of:

maintaining a synchronized time in the node;

obtaining a trigger time for a trigger signal from a test controller for the measurement and control system;

asserting the trigger signal when the time maintained in the node matches the trigger time.

13. The method of claim 12, wherein the step of obtaining comprises the step of obtaining the trigger time using a network connected to the node.

14. The method of claim 12, wherein the step of maintaining a synchronized time comprises the step of synchronizing the time in response to one or more timing data packets carried on a network.

15. The method of claim 12, wherein the time in the synchronized time is real-time and the trigger time is real-time.

* * * * *